United States Patent [19]

Okamura et al.

[11] Patent Number: 4,734,750

[45] Date of Patent: Mar. 29, 1988

[54] HIGH ELECTRON MOBILITY HETEROJUNCTION SEMICONDUCTOR DEVICES

[75] Inventors: Shigeru Okamura, Machida; Tomonori Ishikawa, Fujisawa, both of Japan

[73] Assignee: Fujitsu Limited, Kawasaki, Japan

[21] Appl. No.: 68,820

[22] Filed: Jun. 29, 1987

Related U.S. Application Data

[63] Continuation of Ser. No. 873,151, Jun. 9, 1986, abandoned, which is a continuation of Ser. No. 354,516, Mar. 3, 1982, abandoned.

[30] Foreign Application Priority Data

Mar. 6, 1981 [JP] Japan ................................. 56-32088

[51] Int. Cl.$^4$ ................. H01L 24/80; H01L 27/14; H01L 29/161; H01L 25/04
[52] U.S. Cl. ........................................ 357/16; 357/22; 357/30; 357/51; 357/61; 357/83
[58] Field of Search ............. 357/16, 22, 30, 51, 357/61, 83

[56] References Cited

U.S. PATENT DOCUMENTS

| | | | |
|---|---|---|---|
| 3,448,348 | 6/1969 | Stadler | 357/26 |
| 4,119,994 | 10/1978 | Jain et al. | 357/16 |
| 4,257,055 | 3/1981 | Hess et al. | 357/30 |
| 4,295,002 | 10/1981 | Chappell et al. | 357/30 |
| 4,323,911 | 4/1982 | Campbell et al. | 357/30 |
| 4,354,115 | 10/1982 | Warabisako et al. | 357/19 |
| 4,385,309 | 5/1983 | Queisser et al. | 357/30 |
| 4,424,525 | 1/1984 | Mimura | 357/16 |

OTHER PUBLICATIONS

H. L. Stormer et al. "Two-Dimensional Electron Gas at Differentially Doped GaAs-$A_xGa_{1-x}As$ Heterojunction Interface", *Journal of Vacuum Science and Technology*, vol. 16, (1979), pp. 1517–1519.

Applied Physics Letters, vol. 33, No. 7, Oct. 1, 1978, New York, US, R. Dingle et al.: "Electron Mobilities in Modulation-Doped Semiconductor Heterojunction Superlattices:" pp. 665–667.

Japanese Journal of Applied Physics, vol. 19, No. 5, May 1980, (letters) Tokyo, JP T. Mimura et al.: "A New Field-Effect Transistor with Selectively Doped GaAs/n-$Al_xGA_{1-x}As$ Heterojunctions", pp. L225–L227.

Applied Physics Letters, vol. 37, No. 9, Nov. 1, 1980, New York, US, S. Hiyamizu et al.: "High Mobility of Two-Dimensional Electrons at the GaAs/n-AlGaAs Heterojunction Interface", pp. 805–807.

Applied Physics Letters, vol. 37, No. 11, Dec. 1980, New York, US, L. C. Witkowski et al.: "High Mobilities in $Al_xGa_{1-x}As$–GaAs Heterojunctions", pp. 1033–1035.

Electronics Letters, vol. 17, No. 10, May 14, 1981, London, GB, P. Delescluse et al.: "Transport Properties in GaAs–$Al_xGa_{1-x}As$ Heterostructures and MESFET Application", pp. 342–344.

IBM Technical Disclosure Bulletin, vol. 15, No. 4, Sep. 1972, pp. 1327–1328, New York, US, S. C. C. Tseng et al.: "Electroptical Memory with Write, Read and Erase Characteristics".

Solid State Communications, vol. 29, 1979, "Two-Dimensional Electron Gas at a Semiconductor–Semiconductor Interface", E. L. Stormer et al., pp. 705–709.

*Primary Examiner*—J. Carroll
*Attorney, Agent, or Firm*—Staas & Halsey

[57] ABSTRACT

High electron mobility heterojunction semiconductor devices provided with a means to cause exposure of the electron source layer thereof to an electromagnetic wave allows modulation, adjustment and the like of the characteristics thereof even after completion of the production thereof, thus realizing a considerable magnitude of flexibility in the characteristics as well as considerably different modes in various embodiments, including field effect transistors which allow modulation of threshold voltage etc., connection channels or capacitors having a smaller resistance, programmable memory devices, image sensors. In addition, the high electron mobility heterojunction semiconductor devices can have a much higher operation speed than those available in the prior art.

8 Claims, 17 Drawing Figures

HIGH ELECTRON MOBILITY HETEROJUNCTION SEMICONDUCTOR DEVICES

This is a continuation of co-pending application Ser. No. 873,151, filed on June 9, 1986, abandoned, which is a continuation of U.S. application Ser. No. 354,516, filed Mar. 3, 1982, abandoned.

BACKGROUND OF THE INVENTION

This invention relates to semiconductor devices having as the conductive channel electrons accumulated in the neighborhood of a heterojunction interleaved between a pair of layers of semiconductors having different electron affinities, wherein the accumulated electrons have a large electron mobility. (Such a device is hereinafter referred to as a high electron mobility heterojunction semiconductor device.) More specifically, the invention enables easy adjustment, revision or modulation of the characteristics of the semiconductor devices, after production or after the semiconductor devices are put into practical use, for the ultimate purpose of providing the semiconductor devices with flexibility and to diversify their uses, particularly into the field of memory elements, and the invention further provides methods for employing such the memory elements. The invention can also increase the operating speed of high electron mobility heterojunction semiconductor devices.

A high electron mobility heterojunction semiconductor device is defined as either an active or a passive semiconductor device the conductive channel of which does not include carriers contained in one or more bulk semiconductors, but instead consists of electrons (hereinafter referred to as the two-dimensional electron gas) accumulated in a two-dimensional surface contiguous with a heterojunction that is interleaved between a layer of a first semiconductor such as AlGaAs and a layer of another semiconductor having larger electron affinity then the semiconductor of the first layer such as GaAs. Since the layer of the first semiconductor having the smaller electron affinity supplies electrons to the two-dimensional electron gas, this layer is hereinafter referred to as the electron source layer. Since the semiconductor layer having the larger electron affinity allows electrons to accumulate therein for the ultimate purpose of providing a channel for the two-dimensional electron gas, the latter layer is hereinafter referred to as the channel layer.

The outstanding feature of electrons accumulated in a two-dimensional surface contiguous with a heterojunction interleaved between an electron source layer of a first semiconductor such as AlGaAs and a channel layer of a semiconductor having larger electron affinity than the first semiconductor of the source layer such as GaAs, is that extremely high electron mobility becomes available at cryogenic temperatures, that is, within a temperature range not exceeding 150° K. The thickness of the two-dimensional electron gas which accumulates in the channel layer of e.g. GaAs, in the form of a plane contiguous with the heterojunction, is extremely small, specifically less than 100Å, and can thus be considered for the purposes of the present disclosure to be effectively two-dimensional. Therefore, the two-dimensional electron gas has a geometrical position that is separated from the electron source layer of AlGaAs, for example. As a result, the mobility of the electrons constituting the two-dimensional electron gas becomes free from the effects of ionized-impurity scattering caused by the impurities contained in layers contiguous therewith. It is well-known that ionized-impurity scattering is the major parameter which restricts electron mobility in the cryogenic temperature range. Since the electrons constituting the two-dimensional electron gas are free from the effects of ionized-impurity scattering, as described earlier, the two-dimensional electron gas turns out to have an extremely large electron mobility at temperatures in the cryogenic temperature range. Experiments show that the magnitude of improvement in electron mobility is more than a factor of 10. Electron mobilities of $1.5 \times 10^5 cm^2/VS$ and $5 \times 10^5 cm^2/VS$ were measured respectively at 77° K. and 5° K. for one device having an undoped GaAs channel layer and an n-type AlGaAs electron source layer.

The requirements for pairs of semiconductors which allow the two-dimensional electron gas to accumulate therebetween are (1) an identity or resemblance in lattice constant and (2) a large difference in electron affinity and band gap. Therefore, a number of pairs are available including some examples tabulated below.

| Item | Semiconductor Pair Allowing the Two-dimensional Electron Gas to Accumulate Therebetween | Lattice Constant angstrom | Electron Affinity eV |
|---|---|---|---|
| 1. | AlGaAs | 5.657 | 3.77 |
|    | GaAs   | 5.654 | 4.07 |
| 2. | AlGaAs | 5.657 | 3.77 |
|    | Ge     | 5.658 | 4.13 |
| 3. | GaAs   | 5.654 | 4.07 |
|    | Ge     | 5.658 | 4.13 |
| 4. | CdTe   | 6.477 | 4.28 |
|    | InSb   | 6.479 | 4.59 |
| 5. | GaSb   | 6.095 | 4.06 |
|    | InAs   | 6.058 | 4.9  |

A major example of active high electron mobility heterojunction semiconductor devices is a high electron mobility transistor (hereinafter referred to as a HEMT). Included in the category of passive high electron mobility heterojunction semiconductor devices are capacitors and connection channels, which are usually produced to be associated with one or more HEMTs produced in a substrate on which such capacitors and/or such connection channels are produced.

One of the drawbacks inherently associated with known high electron mobility heterojunction semiconductor devices is that the characteristics thereof cannot be adjusted, revised, modified or modulated, because the characteristics are determined by the layer configuration of the device and the concentration of n-type impurities contained in the electron source layer of the device, both of which cannot be adjusted, revised, modified or modulated, once the device is produced. If the characteristics of a high electron mobility heterojunction semicoductor device could be adjusted, revised, modified or modulated, this would be effective (1) to improve the productivity, and specifically the production yield, of the device, (2) to provide a high electron mobility heterojunction semiconductor device which is capable of adjustment, revision or modulation of the characteristics thereof, and (3) to diversify the uses thereof particularly to the field of a memory element, and specifically of a programmable memory element, a switching element, a sensing element, etc.

The other drawbacks inherently associated with high electron mobility heterojunction semiconductor devices is that the electron mobility of the two-dimensional electron gas is more or less influenced by the ionized impurity scattering phenomenon caused by the ionized impurities existing in the neighborhood of the heterojunction. On the other hand, some type of source of electrons which are free or which are not held by atoms is essential for the electron source layer, because the two-dimensional electron gas requires some quantity of electrons from one of the semiconductor layers constituting a heterojunction along which the two-dimensional electron gas accumulates. In order to satisfy this requirement, the high electron mobility heterojunction semiconductor devices available in the prior art are provided with an electron source layer of a semiconductor having smaller electron affinity than the semiconductor of the channel layer and which contains an n-type impurity. Therefore, one of the potentially easy methods to further increase the electron mobility of the two-dimensional electron gas may be to increase the surface concentration of electrons which constitute the two-dimensional electron gas, because this is effective to increase the screening of the scattering potential, resulting in decreasing the effects of ionized impurity scattering by the impurities contained in the semiconductor layers constituting the heterojunction along which the two-dimensional electron gas accumulates. Increase in the impurity concentration of the semiconductor of an electron source layer is effective to increase the surface concentration of electrons which constitute the two-dimensional electron gas. However, this is inevitably accompanied by an adverse effect in which some quantity of the impurities contained in the electron source layer is diffused into the channel layer during thermal processes which may be carried out in one or more later steps, resulting in increasing the effects of ionized impurity scattering caused by ionized impurities contained in the channel layer, and ultimately offsetting the effects of the increased surface concentration of electrons which constitute the two-dimensional electron gas.

In order to remove this drawback, some of the high electron mobility heterojunction semiconductor devices are provided with a buffer layer containing no impurities and which is produced of a semiconductor which is identical to that of the electron source layer. The thicker is the buffer layer, the greater is the effect of prohibiting the impurity diffusion to the channel layer. On the other hand, a thicker buffer layer reduces the effects of the potential gap caused by the difference in electron affinity, resulting in decreasing the surface concentration of the two-dimensional electron gas. This means that, if it is possible to decrease the concentration of n-type impurities contained in the electron source layer without being accompanied by an adverse effect of decreasing the surface concentration of electrons which constitute the two-dimensional electron gas, this would be effective to increase the electron mobility of the two-dimensional electron gas.

SUMMARY OF THE INVENTION

The first object of the present invention is to provide a high electron mobility heterojunction semiconductor device which allows modulation of its characteristics after completion of the production thereof, and of which the operating speed is further increased.

The second object of the present invention is to provide an active device, specifically a field effect transistor, belonging to the category of high electron mobility heterojunction semiconductor devices, which allows modulation of its characteristics, specifically the threshold voltage, saturated source-drain current, etc., to be carried out after the completion of the production thereof, including increasing the operating speed.

The third object of the present invention is to provide a passive device, specifically a connection channel or a plate of a capacitor, belonging to the category of high electron mobility heterojunction semiconductor devices wherein the resistance thereof is decreased.

The fourth object of the present invention is to provide a method for modulation of the characteristics of a high electron mobility heterojunction semiconductor device to be carried out plural times after the completion of the production thereof.

The fifth object of the present invention is to provide a method for modulation of the characteristics, specifically the threshold voltage, saturated source-drain current, etc., of a HEMT provided with an insulated gate produced employing a transparent or translucent insulator to be carried out plural times after the completion of the production thereof.

The sixth object of the present invention is to provide a programmable memory device provided with one or more high electron mobility heterojunction semiconductor devices.

The seventh object of the present invention is to provide a programmable memory device wherein the writing and reading are conducted by employment of an electromagnetic wave.

The eighth object of the present invention is to provide an apparatus for sensing an image, the apparatus including a plurality of high electron mobility heterojunction semiconductor devices.

To achieve the foregoing first object, a high electron mobility heterojunction semiconductor device in accordance with the present invention is provided with a pair of layers including a first (electron source) layer of a semiconductor containing n-type impurities in low concentration and a second (channel) layer of a semiconductor containing no impurities from a practical viewpoint (that is, effectively no impurities insofar as realizing the objects of the present invention is concerned) and having larger electron affinity than the semiconductor of the source layer, one or more selected portions of the foregoing pair of layers being exposed to irradiation by an electromagnetic wave such as light, at a cryogenic temperature for the purpose of increasing the surface concentration of electrons which are accumulated along the heterojunction between the foregoing pair of layers, a cryogenic container which contains the foregoing pair of layers therein for the purpose of maintaining the increased surface concentration of the foregoing electrons which are accumulated along the heterojunction between the foregoing pair of layers, a means to warm the foregoing pair of layers having one or more selected portions exposed to irradiation by an electromagnetic wave in the case where revision or modulation of the characteristics is required plural times, and preferably a means to emit an electromagnetic wave contained either in or arranged outside the foregoing cryogenic container.

The foregoing exposure to an electromagnetic wave expedites release of electrons from shallow potential levels contained in the electron source layer and/or from the valence band of the electron source layer. The free electrons released by the foregoing exposure increases the surface concentration of the two-dimensional electron gas accumulating along the heterojunction, without being accompanied by any type of adverse effects which enhances the effects of ionized impurity scattering. This increased surface concentration of the two-dimensional electron gas can be maintained for a long time, specifically for more than one year, unless the device is warmed far beyond 77° K. Therefore, it is mandatory that the device be contained in a cryogenic container. The preferred temperature range within which the increased surface concentration of electrons is maintained for a sufficiently long period of time is generally 150° K. or less, depending on the potential levels with which the excited free electrons are to be thermally recombined. It is more preferable to maintain the device within the temperature range of 100° K. or less to ensure the maintenance of the increased concentration of electrons. However, since the increased surface concentration of the two-dimensional electron gas inevitably decreases with an exponential function, a periodic exposure or a type of refreshment is preferable. This is the reason why a means to emit an electromagnetic wave is preferably contained in or arranged outside the cryogenic container. Two different types of layer configuration are included in the category of high electron mobility heterojunction semiconductor devices. The one is provided with an electron source layer grown on a channel layer, and the other is provided with a channel layer grown on an electron source layer. In the former configuration, the electron source layer can be readily exposed to an electromagnetic wave. Incidentally, since the thickness of the channel layer of the latter configuration is approximately 1,000Å, the electron source layer can be exposed to an electromagnetic wave which has penetrated the channel layer, even when the electron source layer is covered by the channel layer.

The foregoing description clarifies that the exposure of a high electron mobility heterojunction semiconductor device to an electromagnetic wave is effective to increase the surface concentration of the two-dimensional electron gas, and that warming of a high electron mobility heterojunction semiconductor device is effective to decrease the surface concentration of the two-dimensional electron gas. These two-way effects provide a high electron mobility heterojunction semiconductor device which allows modulation of its characteristics to be carried out after the completion of the production thereof. As described earlier, this high electron mobility heterojunction semiconductor device can be produced also with a layer configuration of a channel layer grown on an electron source layer. Incidentally, since the increasing of the surface concentration of the two-dimensional electron gas occurs without being accompanied by any increase in the ionized impurity scattering, this readily increases the transmission speed of the electrons constituting the two-dimensional electron gas or the operating speed of a high electron mobility heterojunction semiconductor device in accordance with the present invention.

The foregoing high electron mobility heterojunction semiconductor device can be modified to be provided with a buffer layer of an undoped semiconductor identical to that of the electron source layer, and which is interleaved between the foregoing electron source layer and the foregoing channel layer.

The foregoing high electron mobility heterojunction semiconductor device can be further modified to be provided with an electron source layer containing no n-type impurities from a practical viewpoint, rather than an electron source layer containing n-type impurities to a low concentration.

To achieve the foregoing second object, an active device, specifically a field effect transistor, belonging to the category of high electron mobility heterojunction semiconductor devices in accordance with the present invention, is provided with (a) a pair of layers including a first layer of semiconductor (an electron source layer) containing n-type impurities at a low concentration and a second layer of a semiconductor (a channel layer) containing no impurities from a practical viewpoint, insofar as the present invention is concerned, and having larger electron affinity than the semiconductor of the first layer, the pair of layers being grown on a semiconductor insulating semiconductor substrate, (b) a control electrode either of the Schottky barrier type or of the insulated type placed on the foregoing pair of layers, the foregoing control electrode allowing an electromagnetic wave, e.g. from a source of light, to pass through to reach a portion of the foregoing electron source layer, which portion is located under the foregoing electrode for the purpose of enabling the foregoing portion of the electron source layer located under the control electrode to be exposed to irradiation by an electromagnetic wave at a cryogenic temperature, to increase the surface concentration of electrons which accumulate along the heterojunction between the foregoing pair of layers, (c) a pair of output electrodes placed across the foregoing control electrode on the foregoing pair of layers, (d) a cryogenic container which contains the foregoing pair of layers provided with the foregoing control electrode and the foregoing pair of output electrodes therein, (e) a means to warm the foregoing pair of layers provided with the foregoing control electrode and the foregoing pair of output electrodes in the case where revision or modulation of the characteristics, for example the threshold voltage, the saturated source current, etc., is required plural times, and (f) preferably a means to emit an electromagnetic wave, the means being contained in or arranged outside the foregoing cryogenic container. Various embodiments are available to realize the foregoing control electrode which allows an electromagnetic wave to pass through. In the case of the Schottky barrier type, an opening can be provided at a portion of the control electrode or a thin metal film can be employed to allow an electromagnetic wave to reach the electron source layer. In the case of the insulated gate type, a transparent or translucent insulator such as $Ga_2O_3$ or $Al_2O_3$ can be employed as the material of the insulating layer, on which a metal electrode having an opening provided at a portion thereof, or an electrode of a thin and translucent metal film, is placed. The functional features of this embodiment are clear from the foregoing description presented for the high electron mobility heterojunction semiconductor device satisfying the first object of the present invention.

The foregoing HEMT can be modified to be provided with a buffer layer of an undoped semiconductor identical to that of the electron source layer and which is interleaved between the foregoing pair of semiconductor layers.

The foregoing HEMT can be further modified to be provided with an electron source layer containing no n-type impurities from a practical viewpoint, rather than an electron source layer containing n-type impurities at a low concentration.

The foregoing HEMT can be additionally modified to a configuration wherein (a) the foregoing electron source layer is grown on top of the channel layer, (b) the foregoing control electrode which allows an electromagnetic wave, such as light, to pass through itself and a characteristics-modulation electrode are placed on the top surface of a p-type well produced in a limited upper region of the electron source layer containing n-type impurities. The process of increasing the surface concentration of the two-dimensional electron gas is quite identical to the process which was described above. The process of decreasing the surface concentration of the two-dimensional electron gas is to apply to the characteristics-modulation electrode a positive voltage with respect to the input/output electrodes. This voltage causes the supplying of holes to the electron source layer, thus decreasing the surface concentration of, or even cancelling, the two-dimensional electron gas which accumulates along the heterojunction between the foregoing pair of semiconductor layers. These two-way effects readily realize a HEMT which allows modulation of the characteristics thereof, for example the threshold voltage and saturated source current, to be carried out after the completion of the production thereof. It must be emphasized that this embodiment allows modulation of the characteristics to any marginal extent or to any incremental grade following any specific requirement. It is needless to emphasize that the effect of improving the operating speed is also available. The control electrode can be used as the characteristics-modulation electrode. In other words, a characteristic-modulation electrode is not necessarily an independent piece.

To achieve the foregoing third object, a passive device, specifically a connection channel or a capacitor, belonging to the category of high electron mobility heterojunction semiconductor devices in accordance with the present invention, is provided with (a) a pair of layers including a first layer of a semiconductor (an electron source layer) containing n-type impurities at a low concentration and a second layer of a semiconductor (a channel layer) containing no impurities from a practical view-point and having larger electron affinity than the semiconductor of the first layer, the pair of layers being grown on a semi-insulating semiconductor substrate, the surface of the foregoing pair of layers being covered by a film which does not allow an electromagnetic wave, such as from a source of light, to pass through itself except in one or more portions of the foregoing surface which correspond to one or more connection channels and/or electrodes of one or more capacitors for the purpose of enabling the one or more portions of the electron source layer, which correspond to one or more connection channels and/or electrodes of one or more capacitors, to be exposed to irradiation by the electromagnetic wave at a cryogenic temperature and to increase the surface concentration of electrons which accumulate along the heterojunction between the foregoing pair of layers, (b) a cryogenic container which contains the foregoing pair of layers partly covered by the foregoing opaque film, (c) a means to warm the foregoing pair of layers partly covered by the foregoing opaque film in the case where revision or modulation of the characteristics is required plural times, and (d) preferably a means to emit an electromagnetic wave, the means being contained in or arranged outside the foregoing cryogenic container. Various embodiments are available according to the selection of the material of an opaque film to cover the area of the electron source layer which is desired not to be exposed to an electromagnetic wave. Further embodiments are available depending on whether the area of the electron source layer, which is required to be exposed to an electromagnetic wave, is covered with a particular material or not.

The foregoing passive devices, specifically a connection channel and/or a capacitor, can be modified to be provided with a buffer layer of an undoped semiconductor identical to that of the electron source layer, and which is interleaved between the foregoing pair of semiconductor layers.

The foregoing passive devices, specifically a connection channel and/or a capacitor, can be further modified to be provided with an electron source layer containing no n-type impurities from a practical viewpoint, rather than an electron source layer containing n-type impurities at low concentration.

To achieve the foregoing fourth object, a method for modulation of the characteristics of a high electron mobility heterojunction semiconductor device to be carried out plural times after the completion of the production thereof in accordance with the present invention includes a first step of exposing the high electron mobility heterojunction semiconductor device to an electromagnetic wave having a short wavelength, preferably to an electromagnetic wave having a wavelength corresponding to the band gap of the electron source layer, for the purpose of increasing the surface concentration of electrons accumulated along the heterojunction, and a second step of exposing the high electron mobility heterojunction semiconductor device to an electromagnetic wave having a longer wavelength, preferably to an electromagnetic wave having a wavelength corresponding to the potential barrier between the electron source layer and the channel layer, for the purpose of decreasing the surface concentration of electrons accumulated along the heterojunction. In accordance with this embodiment, it is possible to downwardly modulate the surface concentration of the two-dimensional electron gas which has been increased employing irradiation by an electromagnetic wave. This can be utilized to erase the data stored in a memory element provided with a high electron mobility heterojunction semiconductor device.

To achieve the foregoing fifth object, a method for modulation of the characteristics, specifically the threshold voltage, the saturated source current, etc., of a HEMT provided with an insulated gate produced employing a transparent or translucent insulator to be carried out plural times after the completion of the production thereof in accordance with the present invention includes a first step of exposing the HEMT to an electromagnetic wave, while the insulated gate type control electrode is supplied with no voltage or a negative voltage, which is maintained even after the completion of the exposure, for the purpose of increasing and maintaining the surface concentration of electrons accumulated along the heterojunction, and a second step of applying a positive voltage to the insulated gate type control electrode or of removing a negative voltage which is continuously applied to the insulated gate type control electrode, respectively following each of the two cases described above, for the purpose of decreasing the surface concentration of the electrons accumulated along the heterojunction. It is of course effective to apply a positive voltage to the control electrode, after the removal of the negative voltage wich was continuously applied to the control electrode. The second step causes the expelling of holes accumulated along the surface between the insulator of the insulated gate type control electrode and the electron source layer to the region close to the heterojunction, thus decreasing the surface concentration of the two-dimensional electron gas. In accordance with this embodiment, two-way modulation is possible for the surface concentration of the electrons accumulated along the heterojunction. This means that in accordance with this embodiment, fine adjustment or precise modulation of the threshold voltage is possible for the HEMT provided with an insulated gate produced employing a transparent or translucent insulator.

To achieve the foregoing sixth object, a programmable memory device in accordance with the present invention is a matrix produced of a plurality of high electron mobility heterojunction semiconductor devices, each of which has a conductive channel containing the two-dimensional electron gas and a pair of electrodes (source and drain), but which has no control electrode (gate), and each of which allows modulation of the characteristics thereof, for example the resistance of the conductive channel connecting the output electrodes, to be carried out after the completion of the production thereof. In an array of such devices, all the sources of the above described high electron mobility heterojunction semiconductor devices (each device is virtually a HEMT from which the gate is removed) contained in a row are connected with one another to provide the bit line of the row, and all the drains of the above described high electron mobility heterojunction semiconductor devices contained in a column are connected with one another to provide the word line of the column. The process of writing information in this programmable memory device is to expose a specific limited portion of the device, which portion corresponds to the place on which a gate, if any, would be placed, to an electromagnetic wave such as from a source of light, for the purpose of converting the device to the conductive state, with all the other devices remaining nonconductive, thereby enabling discrimination of a device into which a data has been written from the other devices into which the data has not been written. The process of reading the memory in the foregoing programmable memory device is quite similar to those applicable to any memory device available in the prior art. The process of erasing the memory in the foregoing programmable memory device is to warm the memory device beyond 100° K., preferably beyond 150° K. Therefore, it is practically impossible by this warming method to selectively erase the information stored in particular ones of the memory devices.

It is possible to constitute the foregoing programmable memory device with HEMTs or high electron mobility heterojunction semiconductor devices each of which has a control electrode or a gate, even though the control electrodes are unnecessary for writing information.

It is further possible that the gates of the HEMTs constituting the foregoing programmable memory device are of the insulated gate type or that the gates of the HEMTs constituting the foregoing programmable memory device are produced on a p-type well produced in a selected top portion of the n-type electron source layer. In either of the foregoing cases, it is possible to selectively erase information stored in particular ones of the memory devices.

To achieve the foregoing seventh object, a programmable memory device of which the writing and reading are conducted by employment of an electromagnetic wave in accordance with this invention is provided with: (a) a pair of layers including a first layer of a semiconductor (an electron source layer) containing n-type impurities at a low concentration and a second layer of a semiconductor (a channel layer) containing no impurities from a practical view-point and having larger electron affinity than the semiconductor of the first layer, the foregoing pair of layers being divided into plural areas which are insulated from one another, (b) a cryogenic container which contains the foregoing pair of layers therein, (c) preferably a means for warming the foregoing pair of layers, (d) preferably a means for emitting a first electromagnetic wave which is employed to irradiate one or some of the divided plural areas for the purpose of writing information in a specific one or more of the divided plural areas of the foregoing programmable memory device, (e) a means of emitting a second electromagnetic wave having a wavelength longer than that of the foregoing first electromagnetic wave, the foregoing means being scanned over the foregoing pair of layers to read the information stored in the foregoing programmable memory device, and (f) a means sensitive to light, such as from a set of photodiodes, which receives the reflection of each of the foregoing divided plural areas. This embodiment is based on the principle that the reflection factor is weak for an area around which a large amount of electrons are accumulated and on the principle that an electromagnetic wave having a wavelength longer than a specific amount is not effective to release the electrons accumulated along the heterojunction or to cancel the two-dimensional electron gas.

To achieve the eighth object, an equipment for sensing an image in accordance with the present invention is provided with a plurality of HEMTs which allows modulation of the characteristics, the threshold voltage for example, employing irradiation thereof by an electromagnetic wave, the plurality of HEMTs being arranged along a line or on a surface as an array or a matrix respectively.

BRIEF DESCRIPTION OF THE DRAWINGS

The present invention, together with its various features and advantages, can be readily understood from the following more detailed description presented in conjunction with the following drawings, in which.

DESCRIPTION OF PREFERRED EMBODIMENTS

In the following description, one each of the major embodiments in accordance with the present invention will be presented, on the assumption that the materials of the electron source layer and the channel layer are AlGaAs and GaAs respectively.

Firstly, HEMTs or active high electron mobility heterojunction semiconductor devices in accordance with various embodiments satisfying the second object of the present invention will be described below.

Figure 1:
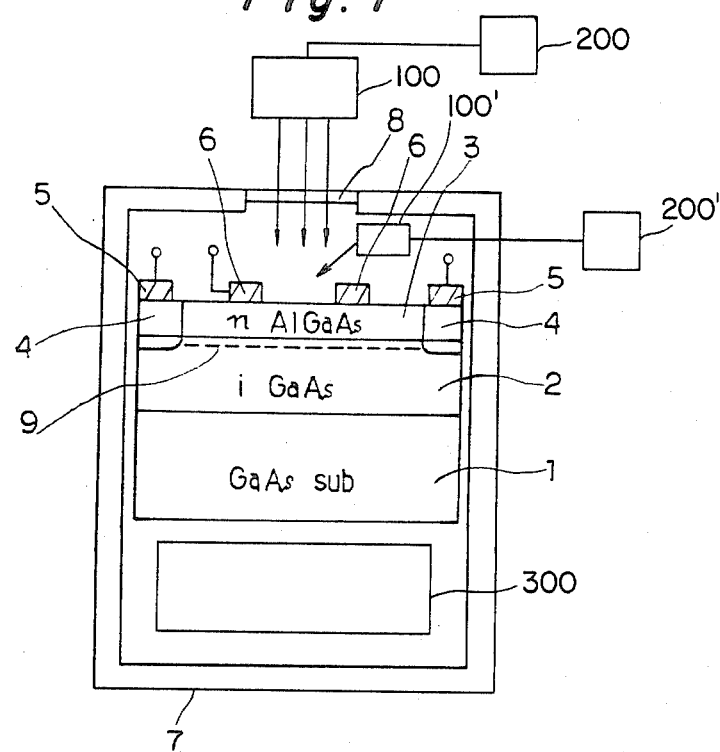
FIG. 1 is a schematic cross-sectional view of a HEMT or an active high electron mobility semiconductor device which allows modulation of the characteristics, specifically the threshold voltage, the saturated source drain current, etc., thereof to be carried out after the completion of the production thereof, and of which the operating speed is further increased in accordance with one embodiment of the present invention.

Referring to FIG. 1, the molecular beam epitaxial process is employed to grow an AlGaAs layer 3 (an electron source layer) containing n-type impurities at a low concentration on an undoped GaAs layer 2 (a channel layer) containing no impurities from a practical viewpoint (that is, effectively no impurities insofar as realizing the objects of the present invention is concerned), which is in turn grown on a Cr doped semi-insulating GaAs substrate 1. The layer configuration is selected so as not to allow the two-dimensional electron gas 9 to accumulate along the heterojunction between the electron source layer 3 and the channel layer 2. In other words, the layer configuration is selected to satisfy the requirements for production of a normally-off type or enhancement mode HEMT. A pair of output electrodes 5 made for instance of a double layer of Au-Ge and Au are ohmicly connected with the channel layer 2 through a couple of alloyed regions 4. A control electrode 6 of Al is placed between the output electrodes 5 on the top surface of the electron source layer 3. The control electrode 6 has a circular shape for the purpose of allowing an electromagnetic wave to reach the electron source layer 3. It is possible to produce the control electrode 6 of a thin film of an electro-conductive material for the purpose of satisying both requirements of electro-conductivity and transparency. Once a portion of the electron source layer 3 located below the control electrode 6 is exposed to an electromagnetic wave such as from a source of light, at a cryogenic temperature, electrons 9 accumulate along the heterojunction between the electron source layer 3 and the channel layer 2 due to the difference in electron affinity, resulting in enabling the modulation or revision of the surface concentration of the electrons 9 which may exist to provide a conductive channel which connects the output electrodes, further resulting in the possibility of modulation or revision of the characteristics of the active high electron mobility heterojunction semiconductor device or the HEMT to be carried out after the completion of the production thereof. Since this two-dimensional electron gas 9 is maintained, unless the device is warmed far beyond 77° K., it is required to keep the device at a cryogenic temperature. This is the reason why the device is contained in a cryogenic container 7. Since it is possible to reduce the surface concentration or to cancel the two-dimensional electron gas 9 by warming the device up to 150° K. or more, a means 300 of warming the device or the pair of layers 2 and 3 is necessary, in the case where revision or modulation of the characteristics, namely the threshold voltage and the saturated source current, is required plural times. Since the modulation or revision of the characteristics of the device is implemented by exposure of the layer configuration to an electromagnetic wave, some type of source of an electromagnetic wave, a light source, is needed. The source 100 or 100' of an electromagnetic wave can be either arranged outside the cryogenic container 7 having a window 8, which allows penetration of an electromagnetic wave, or contained in the cryogenic container 7, respectively. Although the two-dimensional electron gas 9 is maintained for a period long enough from a practical viewpoint, it inevitably decreases exponentially. Therefore, it is preferable that a means to emit an electromagnetic wave be accompanied by a regulator 200, 200' which allows periodic operation of the means for emitting the electromagnetic wave. In this case, a group of semiconductor photodiodes accompanied by a mask having a pattern according to the specific arrangement may be preferable for the means for emitting an electromagnetic wave, from a practical viewpoint.

Figure 2:
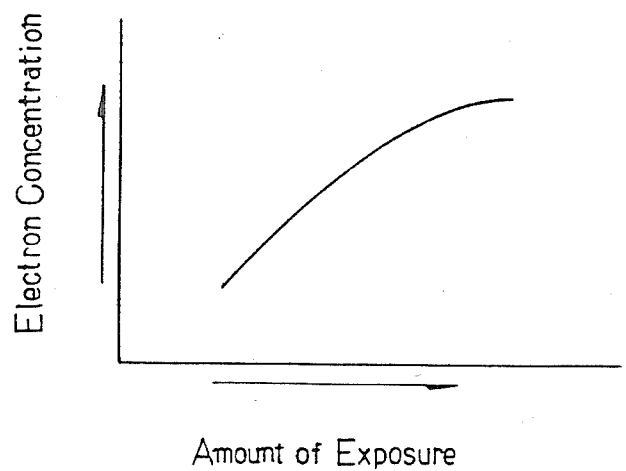
FIG. 2 is a graph showing how the surface concentration of the two-dimensional electron gas changes with the amount of exposure.

Experimental results successfully show that the surface concentration of the two-dimensional electron gas 9 increases depending upon the amount of exposure to light having a wavelength shorter than 10 microns, as illustrated in FIG. 2.

The foregoing description clarifies that a HEMT or an active high electron mobility heterojunction semiconductor device in accordance with this embodiment realizes the possibility of modulation or revision of the characteristics, such as the threshold voltage, saturated source drain current, etc., of the HEMT or the active semiconductor device to be carried out after the completion of the production thereof.

Figure 3:
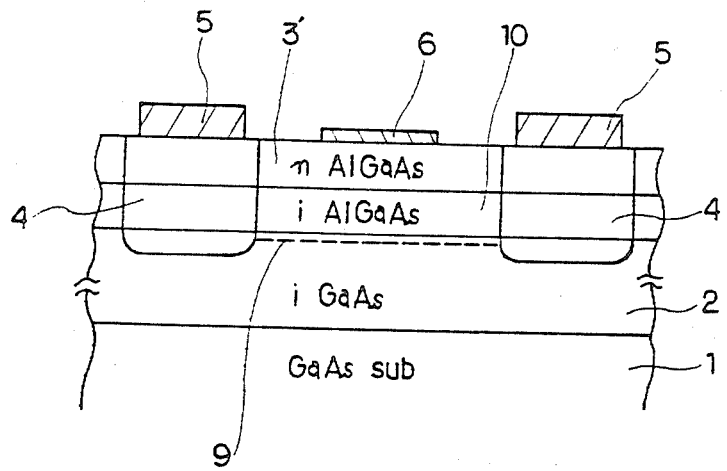
FIG. 3 is a schematic cross-sectional view of a HEMT or an active high electron mobility semiconductor device which allows modulation of the characteristics thereof and of which the operating speed is further increased in accordance with another embodiment of the present invention, wherein a buffer layer is interleaved between the electron source layer and the channel layer.

Referring to FIG. 3, the molecular beam epitaxial process is employed to grow an AlGaAs layer 3' (an electron source layer) containing n-type impurities at a low concentration and having a thickness of 350Å, on an undoped AlGaAs layer 10 (a buffer layer) containing no n-type impurities from a practical viewpoint and having a thickness of 150Å, the undoped AlGaAs layer 10 being grown on an undoped GaAs layer 2 (a channel layer) containing no impurities from a practical viewpoint and which is itself grown on a Cr doped semi-insulating GaAs substrate 1. A pair of input/output electrodes 5 made of a double layer of Au-Ge and Au is ohmically connected with the channel layer 2 through a pair of alloyed regions 4. A control electrode 6 of an Al thin film having a thickness of 100Å is placed between the input and output electrodes 5 on the top surface of the electron source layer 3'. Since the thickness of the control electrode 6 is very thin, it allows an electromagnetic wave to penetrate through it. The situation is the same as in the foregoing embodiments, as to the necessity of a cryogenic container, the preference of a means to warm the device, and the preferences of a means for emission of an electromagnetic wave accompanied by a regulator which allows periodic operation of the means for emission of the electromagnetic wave. In this layer configuration, the two-dimensional electron gas 9 accumulates along the heterojunction between the buffer layer 10 and the channel layer 2. However, the surface concentration of the two-dimensional electron gas 9 and the electron mobility thereof are respectively $3.5 \times 10^{11}$/cm$^2$ and 160,000 cm$^2$/Vsec at 77° K. and are respectively $3.4 \times 10^{11}$/cm$^2$ and 540,000 cm$^2$/Vsec at 5° K. Once a portion of the electron source layer 3' is exposed to an electromagnetic wave at a cryogenic temperature, the surface concentration of the two-dimensional electron gas 9 and the electron mobility thereof respectively increase to $5.0 \times 10^{11}$/cm$^2$ and 180,000 cm$^2$/Vsec at 77° K. and to $5.7 \times 10^{11}$/cm$^2$ and 1,050,000 cm$^2$/Vsec at 5° K.

The foregoing description clarifies that a HEMT or an active high electron mobility heterojunction semiconductor device in accordance with this embodiment, wherein a buffer layer of an AlGaAs layer containing no n-type impurities is additionally provided, realizes not only the possibility of modulation or revision of the characteristics, for example the threshold voltage, saturated source-drain current, etc., but also that increase in the electron mobility of the two-dimensional electron gas may be achieved, resulting in an increased operation speed of the HEMT or of the active semiconductor device.

Figure 4:
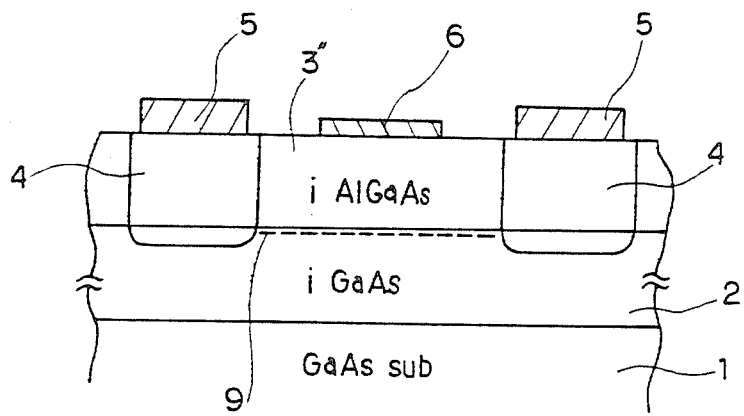
FIG. 4 is a schematic cross-sectional view of a HEMT or an active high electron mobility semiconductor device which allows modulation of the characteristic thereof and of which the operating speed is further increased in accordance with the third embodiment of the present invention, wherein the electron source layer contains no impurities.

FIG. 4 illustrates a layer configuration of a HEMT or an active high electron mobility heterojunction semiconductor device which allows modulation of the characteristics, e.g., the threshold voltage, the saturated source-drain current, etc., to be carried out after the completion of the production thereof in accordance with another embodiment of the present invention. The major differences between the layer configuration of this embodiment and the layer configuration illustrated in FIG. 1 are that the electron source layer 3'' having a thickness of 500Å does not contain n-type impurities from a practical viewpoint and that the control electrode 6 is a thin Al film which allows penetration of an electromagnetic wave. The situation is the same as in other foregoing embodiments, as to the necessity of a cryogenic container, the preference of a means to warm the device and the preference of a means for emission of an electromagnetic wave accompanied by a regulator which allows periodic operation of the means for emission of the electromagnetic wave. In this layer configuration, no two-dimensional electron gas 9 accumulates along the heterojunction between the electron source layer 3'' and the channel layer 2, prior to exposure by an electromagnetic wave. However, once a portion of the electron source layer 3'' is exposed to an electromagnetic wave at a cryogenic temperature, electrons are released from shallow potential levels contained in the electron source layer and/or from the valence band of the electron source layer, and electrons 9 accumulate along the heterojunction between the electron source layer 3 and the channel layer 2 due to the difference in electron affinity. This means that modulation or revision of the characteristics of the device can be carried out by exposure of the device to an electromagnetic wave. Moreover, experimental results show that the surface concentration of the two-dimensional electron gas 9 and the electron mobility thereof are respectively $4.5 \times 10^{11}$/cm$^2$ and 200,000 cm$^2$/Vsec at 77° K. and are respectively $5.0 \times 10^{11}$/cm$^2$ and 1,200,000 cm$^2$/Vsec at 5° K. In comparison with the experimental results for the pre-exposure position of the layer configuration illustrated in FIG. 1, this indicates a considerable magnitude of improvement particularly for the electron mobility available at 5° K., resulting in causing a considerable improvement for the operating speed of the HEMTs or the active high electron mobility heterojunction semiconductor devices.

Figure 5:
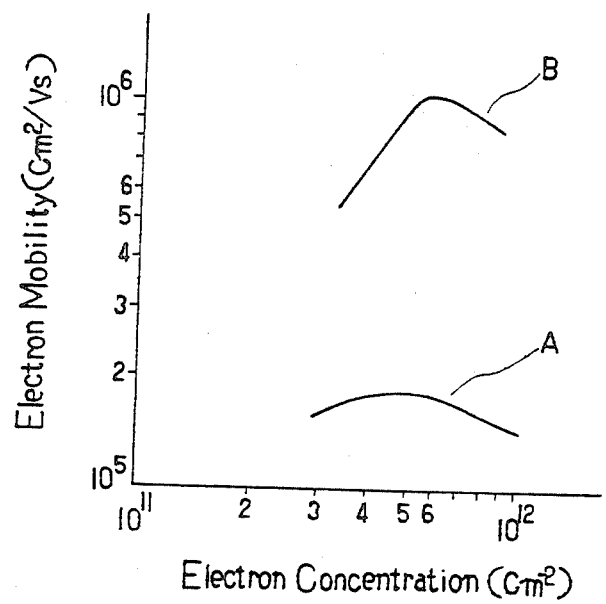
FIG. 5 is a graph showing the relations between the electron mobility and the surface concentration of the two-dimensional electron gas.

It is interesting that the relationship between the electron mobility and the surface concentration of the two-dimensional electron gas is not linear but has a peak, as illustrated in FIG. 5, although the surface concentration of the two-dimensional electron gas increases following the amount of exposure to an electromagnetic wave, as illustrated in FIG. 2. In FIG. 5, the curves A and B respectively show experimental results at 77° K. and 5° K. This phenomenon, in combination with the exponential decrease in the surface concentration of the two-dimensional electron gas, can provide a parameter for selection of the preferable amount of exposure.

The foregoing description clarifies that a HEMT or an active high electron mobility heterojunction semiconductor device in accordance with this embodiment, wherein the electron source layer contains no n-type impurities, realizes the possibility of modulation or revision of the characteristics, such as the threshold voltage, saturated source-drain current, etc., and a further increase in the electron mobility of the two-dimensional electron gas, resulting in a further increased operating speed of the HEMT or the active semiconductor device to be carried out after the completion of production thereof.

Figure 6:
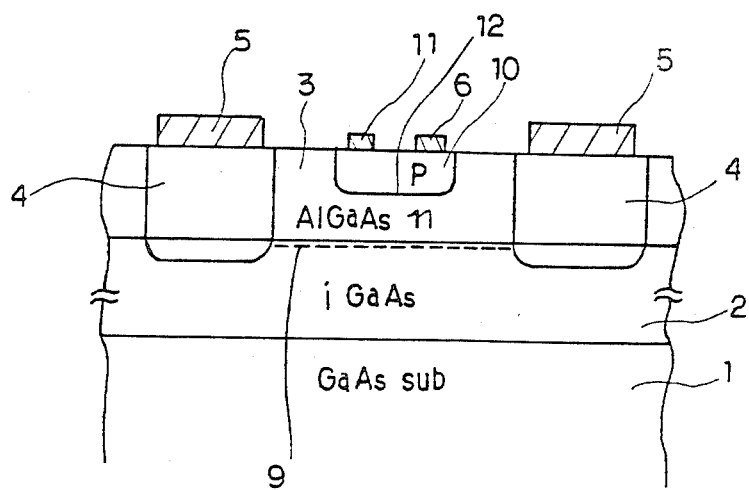
FIG. 6 is a schematic cross-sectional view of a HEMT or an active high electron mobility semiconductor device which allows fine modulation or fine adjustment of the characteristics thereof without warming it in accordance with the fourth embodiment of the present invention, wherein the electron source layer is provided with a p-n junction at the upper portion thereof and the control electrode as well as a characteristics-modulation electrode is placed on the top surface of the p-type region of the electron source layer.

FIG. 6 illustrates a layer configuration of a HEMT or an active high electron mobility heterojunction semiconductor device which allows modulation of its characteristics, such as the threshold voltage, the saturated source-drain current, etc., to be carried out after the completion of the production thereof in accordance with another emobodiment of the present invention. The major differences between the layer configuration of this embodiment and the layer configuration illustrated in FIG. 1, are that a p-type well 10 is produced in a limited upper region of the electron layer source layer 3 containing n-type impurities for the purpose of producing a p-n junction 12 therebetween, and that a control electrode 6 of an Au-Zn film which is thin enough to allow an electromagnetic wave, such as light, to pass therethrough and has a circular shape, and a characteristics-modulation electrode 11, are placed on the top surface of the foregoing p-type well 10. As described earlier, the control electrode 6 can be used also as the characteristics-modulation electrode 11. In other words, the characteristics-modulation electrode 11 is not necessarily an independent piece. Since the thickness of an electron source layer 3 is ordinarily less than 0.1 microns, it is not necessarily easy to produce a p-n junction in a layer having such a small thickness. Therefore, it is easy and convenient to produce a p-type region in the top portion of an undoped AlGaAs layer grown on an electron source layer of the n-type AlGaAs layer. In this case, a p-i-n junction is produced rather than a p-n junction. Another method is available in which a p-type AlGaAs layer is grown on an electron source layer of the n-type AlGaAs layer, and then the p-type AlGaAs layer is removed by an etching process, leaving the p-type AlGaAs layer selectively on a control electrode and on a characteristics-modulation electrode. In this case, one or more mesas remain on the top surface of the layer configuration. The situation is the same as in the foregoing other embodiments, as to the necessity of a cryogenic container, the preferences of a means for emission of an electromagnetic wave accompanied by a regulator which allows periodic operation of the means for emission of the electromagnetic wave. However, a means of warming the device is not necessary, because decrease of the surface concentration or cancellation of the two-dimensional electron gas can be carried out as described below without warming the device.

The process of increasing the surface concentration of the two-dimensional electron gas is quite identical to the process to be applied to a HEMT in accordance with any of the foregoing other embodiments. In other words, the electron source layer is exposed to an electromagnetic wave, such as light, having a wavelength short enough to excite electrons contained in shallow levels or even in the valence band of the material of the electron source layer, while the device is maintained at a cryogenic temperature, or a temperature less than 150° K. The process of decreasing the surface concentration of the two-dimensional electron gas is to apply a positive voltage to the characteristics-modulation electrode 11 and a negative voltage to the output electrode 5. This voltage causes holes to move from the p-type well 10 to the n-type region of the electron source layer 3. As a result, the surface concentration of the two-dimensional electron gas 9 is decreased depending on the voltage applied between the characteristics-modulation electrode 11 and the input/output electrode 5. If the voltage is sufficiently large, the two-dimensional electron gas is entirely cancelled. It must be emphasized that the HEMTs in accordance with this embodiment allow modulation of the characteristics, such as the threshold voltage, the saturated source-drain current, etc., to any required marginal extent depending on the voltage. Therefore, a fine adjustment or modulation of the threshold voltage, the saturated source-drain current, etc., is readily possible without warming the device.

The foregoing description clarifies that a HEMT or an active high electron mobility heterojunction semiconductor device in accordance with this embodiment, of which the electron source layer is provided with a p-n junction and of which the control electrode and a characteristics-modulation electrode are placed on the top surface of the foregoing p-type region, realizes the possibility of a fine modulation or a fine adjustment of the characteristics, such as the threshold voltage, saturated source-drain current, etc., without warming the device.

Secondly, a passive high electron mobility heterojunction semiconductor device, specifically (1) a connection channel which connects a source and a gate or a gate and a drain of a transistor, (2) a connection channel which connects transistors produced in one chip, or (3) an electrode of a capacitor, in accordance with an embodiment satisfying the third object of the present invention, will be described below.

Figure 7:
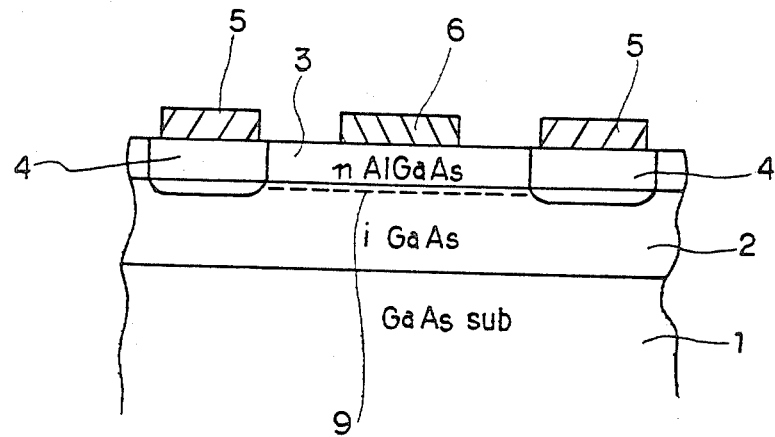
FIG. 7 is a schematic cross-sectional view of a HEMT provided with connection channels or passive devices in accordance with one embodiment satisfying the third object of the present invention.

FIG. 7 illustrates a layer configuration of a HEMT provided with connection channels which, in accordance with an embodiment satisfying the third object of the present invention, connect the source and the gate, and the gate and the drain, of the HEMT. Referring to FIG. 7, the molecular beam epitaxial process is employed to grow an AlGaAs layer 3 (an electron source layer) containing n-type impurities at a low concentration on an undoped GaAs layer 2 (a channel layer) containing no impurities from a practical viewpoint, which was itself grown on a Cr doped semi-insulating GaAs substrate 1. The n-type impurity concentration of the electron source layer 3 is selected to be $2 \times 10^{18}/cm^3$. The thickness of the electron source layer 3 and the channel layer 2 are selected respectively to be 0.06 microns and 0.6 microns. This lattice profile allows the two-dimensional electron gas to accumulate with a surface concentration of $3 \times 10^{11}/cm^2$. A pair of output electrodes 5 made of a double layer of Au-Ge and Au is ohmically connected with the channel layer 2 through a pair of alloyed regions 4 which is produced employing the annealing process at 450° C. A control electrode 6 of Al is placed between the output electrode 5 on the top surface of the electron source layer 3.

Once the electron source layer 3 is exposed to an electromagnetic wave, such as from a source of light, having a wavelength shorter than that corresponding to the band gap of AlGaAs at a cryogenic temperature around 77° K, the surface concentration and the electron mobility of the two-dimensional electron gas are increased, resulting in decreasing the resistance of the connection channels which connect the source and the gate, and the gate and the drain, of the HEMT. As a result, the cut-off frequency of the HEMT increases and the noise level of the HEMT decreases. During the exposure process, the control gate acts as a mask. Therefore, the original values of the characteristics of the HEMT, such as the threshold voltage, the saturated source-drain current, etc., of the HEMT are not influenced by the exposure. In the case where a passive device in accordance with this embodiment is employed as a connection channel which connects transistors or as an electrode of a capacitor, an opaque film to cover the area of the electron source layer which is not desired to be exposed to an electromagnetic wave is required. Experimental results show that the surface concentration and the electron mobility of the two-dimensional electron gas increased to respectively $9.0 \times 10^{11}/cm^2$ and 152,000 $cm^2/Vsec$ from respectively $4.7 \times 10^{11}/cm^2$ and 103,000 $cm^2/Vsec$, causing as a result the resistance between the source and the drain to decrease to one-third its original value. The situation is the same as in the foregoing embodiments, as to the necessity of a cryogenic container, the preference of a means to warm the device, and the preferences of a means for emission of an electromagnetic wave accompanied by a regulator which allows periodic operation of the means for emission of the electromagnetic wave.

The foregoing description clarifies that a passive high electron mobility heterojunction semiconductor device in accordance with this embodiment can realize a reduction in the resistance of (1) connection channels or (2) an electrode of a capacitor, resulting in an improvement of the cut-off frequency and the noise level of a HEMT, or of the time constant of a capacitor. It is possible to apply the idea of a buffer layer and/or the idea of an electron source layer of a semiconductor containing no impurities to this embodiment.

Thirdly, a method for modulation of the characteristics of a high electron mobility heterojunction semiconductor device to be carried out plural times after the completion of the production thereof in accordance with an embodiment satisfying the fourth object of the present invention will be described below.

Figure 8:
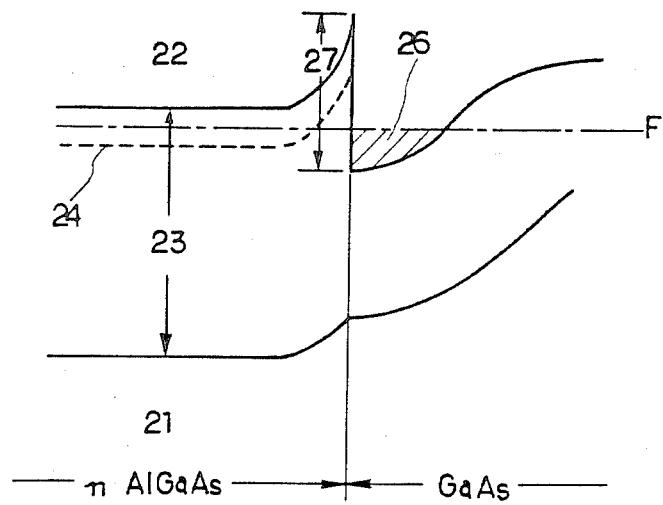
FIG. 8 is an energy band diagram of a high electron mobility heterojunction semiconductor device provided with an electron source layer of AlGaAs containing n-type impurities and a channel layer of GaAs containing no impurities.

FIG. 8 illustrates an energy band diagram of a high electron mobility heterojunction semiconductor device provided with an AlGaAs layer containing n-type impurities (an electron source layer) and a GaAs layer containing no impurities (a channel layer). Referring to FIG. 8, the areas indicated as 21 and 22 are respectively the valence band and the conduction band. The line indicated as F is the Fermi level. The band gap of AlGaAs indicated as 23 is approximately 1.8 eV. The difference in electron affinity of AlGaAs and GaAs allows electrons of the shallow level 24, caused by introduction of Si as a donor, to accumulate in the potential well 26. Once the electron source layer of AlGaAs containing n-type impurities is exposed to light having a wavelength shorter than the wavelength corresponding to the band gap 23 of 1.8 eV at a cryogenic temperature, an additional quantity of electrons moves from the valence band 21 to the potential well 26. This two-dimensional electron gas which accumulates along the heterojunction between the electron source layer and the channel layer remains even after the light emission is terminated, because a potential barrier 27 between the electron source layer and the channel layer amounting to 0.3 eV prohibits the two-dimensional electron gas from moving backward to the valence band 21 of the electron source layer. This is the principle which allows an exposure of a high electron mobility heterojunction semiconductor device to an electromagnetic wave, from a source of light, to increase the surface concentration and the electron mobility of the two-dimensional electron gas. The two-dimensional electron gas can be released by application of an amount of energy in excess of the potential barrier 7 between the electron source layer and the channel layer. Therefore, irradiation with light having a wavelength corresponding to the potential barrier is effective to release the two-dimensional electron gas. On the other hand, however, this amount of energy is not large enough to move electrons from the valence band 21 of the electron source layer to the potential well 26. Therefore, the foregoing application of an electromagnetic wave is effective to modulate the surface concentration of the two-dimensional electron gas.

In conclusion, a method which includes a first step of exposing a high electron mobility heterojunction semiconductor device to an electromagnetic wave having a shorter wavelength, preferably to an electromagnetic wave, such as from a source of light, having a wavelength corresponding to the band gap of the electron source layer thereof, for the purpose of increasing the surface concentration of the two-dimensional electron gas, and a second step of exposing the high electron mobility heterojunction semiconductor device to an electromagnetic wave having a longer wavelength, preferably to an electromagnetic wave having a wavelength corresponding to the potential barrier between the electron source layer and the channel layer, for the purpose of decreasing the surface concentration of the two-dimensional electron gas, is determined to satisfy the fourth object of the present invention.

In the case of the embodiment of which the layer configuration is illustrated in FIG. 8, the longest end of the preferable wavelength range of light employed for the first step is approximately 0.7 microns, because the band gap of AlGaAs is 1.8 eV. The longest end of preferable wavelength range of light employed for the second step is approximately 4 microns, because the potential barrier between AlGaAs and GaAs is 0.3 eV.

The foregoing description clarifies that a method in accordance with this embodiment realizes the possibility of upward and downward modulation of the surface concentration of the two-dimensional electron gas. This method is effective to diversify the uses of high electron mobility heterojunction semiconductor devices particularly to the field of memory devices, because this method can be utilized to erase a memory storage in a memory element which is based on the principle that the characteristics of a high electron mobility heterojunction semiconductor device, such as a HEMT, can be modulated by exposure thereof to an electromagnetic wave, such as from a source of light.

Fourthly, a method for modulating the characteristics, specifically the threshold voltages, of a HEMT with an insulated gate and a transparent or translucent insulator, to be carried out plural times after the completion of the production thereof, in accordance with an embodiment satisfying the fifth object of the present invention, will be described below.

Figure 9:
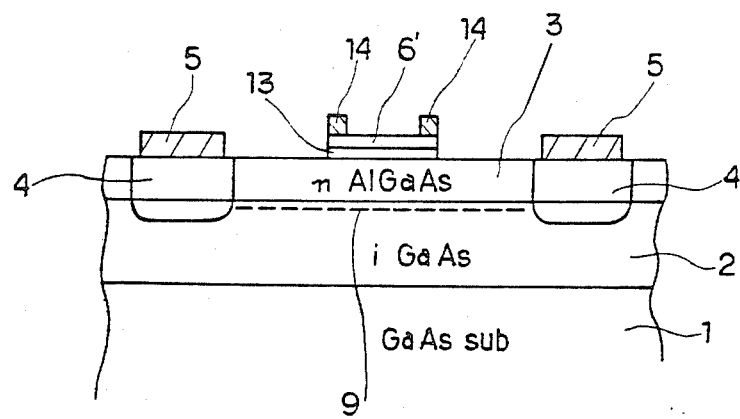
FIG. 9 is a schematic cross-sectional view of a HEMT provided with an insulated gate produced on a transparent or translucent insulator in accordance with one embodiment of the present invention.

FIG. 9 illustrates a layer configuration of a HEMT provided with an insulated gate produced on a transparent or translucent insulator such as $Ga_2O_3$, $Al_2O_3$ and the like. Referring to FIG. 9, an AlGaAs layer 3 (an electron source layer) having a thickness of 0.1 microns and containing n-type impurities to a concentration of $1\times10^{18}/cm^3$ is grown on a GaAs layer 2 (a channel layer) having a thickness of 1 micron and containing no impurities from a practical viewpoint, which is itself grown on a Cr doped semi-insulating GaAs substrate 1. This lattice profile allows the two-dimensional electron gas 9 having an electron mobility of $1.1\times10^5$ cm$^2$/Vsec to accumulate with a surface concentrationof $5\times10^{11}/cm^2$. A pair of output electrodes 5 made of a double layer of Au-Ge and Au having a thickness of 0.3 microns is ohmically connected with the channel layer 2 through a pair of alloyed regions 4 which are produced employing the annealing process at 450° C. The layer 13 is an insulator layer of a mixture of $Al_2O_3$ produced employing an oxidation process applied at a temperature of 550° C. to the AlGaAs layer 3 partly covered by an $SiO_2$ mask. On top of this insulator layer 13, having a thickness of 0.04 microns, is plated a control electrode 6' of an Al film which is thin enough to allow light to pass through, for instance 100Å thick. To obtain a good ohmic connection with this control electrode 6', a circular bonding pad 14 of an Au film having a thickness of 0.3 microns is arranged on the control electrode 6'. The situation is the same as in the foregoing embodiments, as to the necessity of a cryogenic container, the preference of a means to warm the device, and the preference of a means for emission of an electromagnetic wave accompanied by a regulator which allows periodic operation of the means for emission of the electromagnetic wave.

Figure 10:
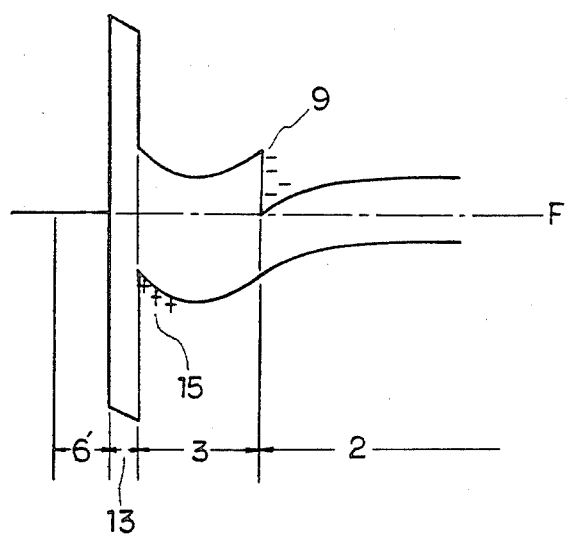
FIG. 10 is an energy band diagram of a HEMT provided with an insulated gate, showing the position after the HEMT is exposed to light at a cryogenic temperature.

Once the control electrode 6' is exposed to an electromagnetic wave such as light, at a cryogenic temperature such as 77° K, the surface concentration and the electron mobility of the two-dimensional electron gas 9 have been observed to respectively increase to $9\times10^{11}/cm^2$ and $1.4\times10^5$ cm$^2$/Vsec, and the threshold voltage was observed to increase to 0.7 V from 0.5 V. FIG. 10 illustrates an energy band diagram of the foregoing HEMT, showing the position after the HEMT is exposed to light at a cryogenic temperature. Referring to FIG. 10, the two-dimensional electron gas 9 accumulates along a heterojunction between the channel layer 2 and the electron source layer 3, and holes 15 accumulate in the electron source layer 3 along the interface between the insulating layer 13.

The foregoing exposure of the control electrode 6' is much more effective, if it is carried out while the control electrode 6' is supplied with a negative voltage of approximately 0.3 V.

Figure 11:
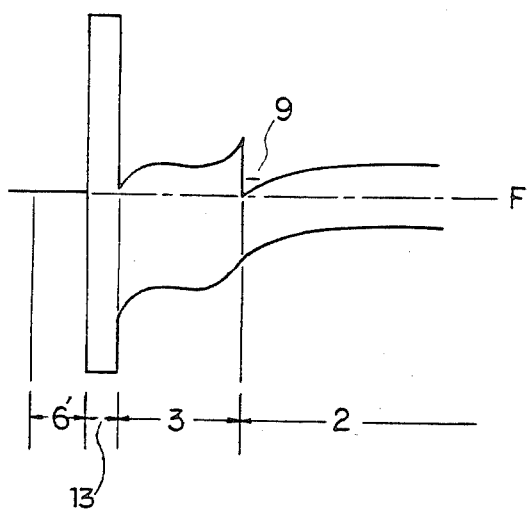
FIG. 11 is an energy band diagram of a HEMT provided with an insulated gate, showing the position after the control gate of the HEMT is supplied with a positive voltage.

Thereafter, when a positive voltage of such as 1.2 V is applied to the control gate 6', the energy band diagram is changed as illustrated in FIG. 11. Referring to FIG. 11, the holes 15 accumulated along the interface between the insulating layer 13 and the electron source layer 3 are expelled toward the channel layer 2, resulting in decreasing the surface concentration of the two-dimensional electron gas 9.

The surface concentration of the two-dimensional electron gas 9, accumulated by the exposure of the control electrode 13 to an electromagnetic wave under the condition that the control electrode 13 is supplied with a negative potential, can be reduced to any desired extent depending on the potential voltage applied thereto. This means that a fine downward modulation of the surface concentration of the two-dimensional electron gas is possible.

In conclusion, a method which includes a first step of exposing a HEMT provided with an insulated gate produced employing a transparent or translucent insulator to an electromagnetic wave, while the insulated gate type control electrode is supplied with no voltage or a negative voltage, for the purpose of increasing the surface concentration of the two-dimensional electron gas, and a second step of applying a positive voltage to or to remove the negative voltage from the insulated gate type control electrode, for the purpose of decreasing the surface concentration of the two-dimensional electron gas, is determined to satisfy the fifth object of the present invention.

The foregoing description clarifies that a method in accordance with this embodiment realizes the possibility of fine adjustment or precise modulation of the characteristics, particularly the threshold voltage, of a HEMT provided with an insulated gate produced employing a transparent or translucent insulator such as $Ga_2O_3$, $Al_2O_3$ and the like.

Fifthly, a programmable memory device in accordance with an embodiment satisfying the sixth object of the present invention will be described below.

High electron mobility heterojunction semiconductor devices including HEMTs in accordance with the present invention allow modulation of the characteristics thereof, specifically the resistance of the conductive channel thereof, such modulation being carried out by exposure of the devices at a cryogenic temperature to an electromagnetic wave such as from a source of light. This means that selective exposure of a selected one of a group of high electron mobility heterojunction semiconductor devices such as HEMTs to light, such as from a laser, enables discrimination of the exposed device from the others in the group. This further means that a plurality of high electron mobility heterojunction semiconductor devices can constitute a memory device in which the writing is carried out by selective exposure of an addressed one of the devices, and in which the reading is carried out by selection of a device the resistance of which is different from the others. Therefore, a matrix including a plurality of high electron mobility heterojunction semiconductor devices, each of which has two ouput electrodes and a conductive channel in which the two-dimensional electron gas will accumulate upon exposure of the device to an electromagnetic wave (or each of which is a HEMT from which the control electrode is removed), and each of which allows modulation of the characteristics thereof to be carried out by exposure of the device to an electromagnetic wave, can provide a programmable memory device. In this programmable memory device, all the corresponding output electrodes of the high electron mobility heterojunction semiconductor devices contained in a row are connected with one another to provide the bit line of the row, and all the other corresponding output electrodes of the high electron mobility heterojunction semiconductor devices contained in a column are connected with one another to provide the word line of the column, to thusly provide a programmable memory device. The process of writing information in this programmable memory device is to selectively expose an addressed one of the group of devices to an electromagnetic wave. The process of reading the information stored in the programmable memory device is to apply a voltage to each of the individual devices in progression, as is usual with the process for the memory devices available in the prior art. The process of erasing the information stored in the programmable memory device is to simply warm the programmable memory device beyond at least 100° K.

Various embodiments and/or modifications are available for the foregoing programmable memory device in accordance with this embodiment of the present invention. Examples are (a) a programmable memory device provided with a plurality of HEMTs which allows modulation of the characteristics thereof to be carried out by exposure thereof to an electromagnetic wave in accordance with an embodiment of the present invention satisfying the second object of the present invention, (b) a programmable memory device provided with a plurality of HEMTs each of which is provided with an insulated gate type control electrode in accordance with an embodiment of the present invention, and (c) a programmable memory device provided with a plurality of HEMTs each of which is provided with a control electrode and a characteristics-modulation electrode provided on a p-type well produced in a limited upper region of the electron source layer in accordance with an embodiment of the present invention.

The foregoing description clarifies that a plurality of programmable memory devices, all of which fall under the same category in which a plurality of high electron mobility heterojunction semiconductor devices allow modulation of the characteristics thereof to be carried out by exposure thereof to an electromagnetic wave, are realized in accordance with these embodiments satisfying the sixth object of the present invention.

Sixthly, a programmable memory device of which the writing and reading of information are conducted by employment of an electromagnetic wave in accordance with an embodiment satisfying the seventh object of the present invention will be described below.

A new phenomenon was discovered in which a high electron mobility heterojunction semiconductor device, which allows modulation of the characteristics thereof to be carried out by exposure thereof to an electromagnetic wave at a cryogenic temperature in accordance with the present invention, provides a unique medium of memory function. Namely, the reflection factor for a region in which the surface concentration of the two-dimensional electron gas is increased by exposure of the region to an electromagnetic wave, is different from the reflection factor for a region in which the surface concentration of the two-dimensional electron gas has not yet been increased by exposure of the region to an electromagnetic wave. This means that selective exposure of a selected one of a group of high electron mobility heterojunction semiconductor devices, each of which is not provided with any type of electrodes, enables discrimination of the exposed one from the others included in the group of such a specific type of high electron mobility heterojunction semiconductor devices as described above. This specific type of high electron mobility heterojunction semiconductor device can be employed as a memory element which may be also defined as an insulated block of a layer configuration provided with an electron source layer of a semiconductor containing n-type impurities and a channel layer of a semiconductor having larger electron affinity than the semiconductor of the source layer containing no impurities. Since this memory element is not provided with any type of electrode, it may not be appropriate to include the memory element in the category of electronic devices. In any case, however, a matrix including a plurality of the memory elements evidently acts as a programmable memory device, when it is additionally provided with a means to emit a first electromagnetic wave which is employed to write information in the memory element, a means to emit a second electromagnetic wave having a wavelength longer than that of the first electromagnetic wave which is scanned over the matrix to read the information stored in the memory element, and means sensitive to a light, such as a set of photosensitivity elements, which receive the reflection of each of the memory elements.

Figure 12:
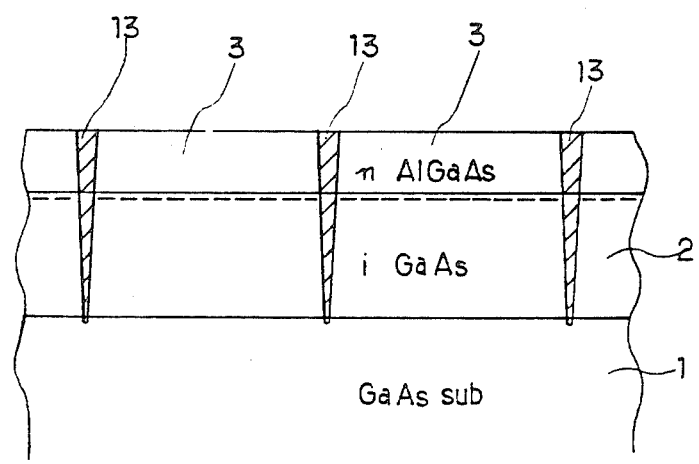
FIG. 12 is a schematic cross-sectional view of a programmable memory device provided with a plurality of high electron mobility heterojunction semiconductor devices having no electrodes or a plurality of insulated blocks of layer configuration provided with an electron source layer of a semiconductor containing n-type impurities and a channel layer of a semiconductor having larger electron affinity than the semiconductor of the first layer and containing no impurities in accordance with one embodiment of the present invention.
Figure 13:
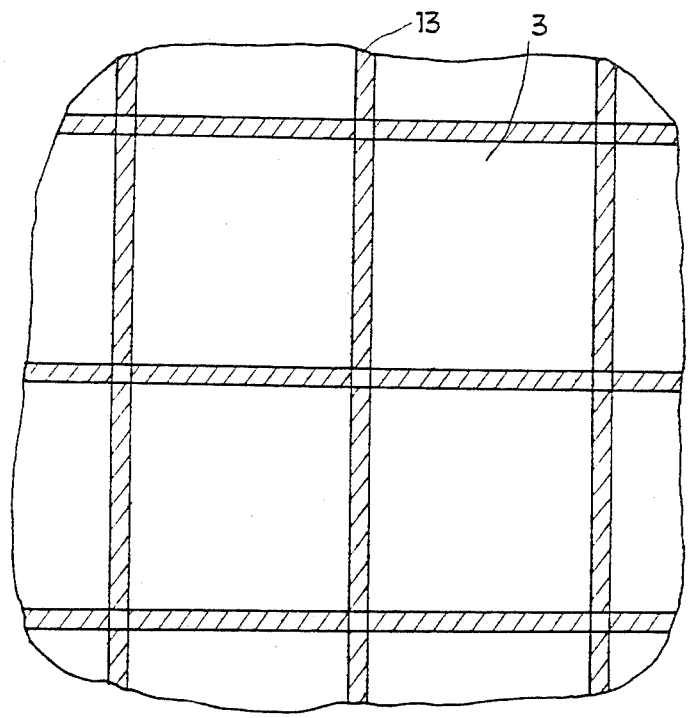
FIG. 13 is a schematic plan view of a programmable memory device of which the cross-sectional view is illustrated in FIG. 12.

FIGS. 12 and 13 respectively illustrate the layer configuration of a programmable memory device in accordance with this embodiment. Referring to FIGS. 12 and 13, an electron source layer 3 of AlGaAs containing n-type impurities is grown on a channel layer 2 of GaAs containing no impurities, which itself is grown on a Cr doped semi-insulating GaAs substrate 1. The double layers of the electron source layer 3 and the channel layer 2 are divided into a plurality of memory elements insulated from one another by a plurality of insulating belts 13.

The writing process is to expose an addressed memory element 13 to an electromagnetic wave, such as from a source of light such as a laser, having a wavelength short enough to accumulate the two-dimensional electron gas 9 along the heterojunction between the electron source layer 3 and the channel layer 2. Since each memory element is insulated from the others, the two-dimensional electron gas is maintained in the addressed memory element. The reading process is to expose each memory element in progression, for instance by means of scanning the irradiation, to an electromagnetic wave, e.g. from a source of light such as a laser, having a wavelength long enough not to disperse the two-dimensional electron gas, and a photosensitive element determines whether or not the two-dimensional electron gas is accumulated in the addressed memory element by detecting the amount of the reflection therefrom. The memory can be erased by warming the memory device.

Various embodiments and/or modifications are available for the foregoing programmable memory device, depending on the method of erasure of the stored information. Examples are (a) a programmable memory device provided with a plurality of the foregoing insulated blocks of a layer configuration each of which is further provided with an insulated gate type control electrode and each of which is insulated from one another, and (b) a programmable memory device provided with a plurality of insulated blocks of a layer configuration each of which has the electron source layer grown on the channel layer and each of which has a control electrode placed on a p-type well produced in a limited upper region of the electron source layer.

The foregoing description clarifies that a plurality of programmable memory devices of which the writing and reading of information are conducted by employment of an electromagnetic wave, for example from a source of light such as a laser, is realized in accordance with any of these embodiments, satisfying the seventh object of the present invention.

Seventhly, an equipment for sensing an image having the memory function and/or having a large cross-sectional area thereof in accordance with an embodiment satisfying the eighth object of the present invention will be described below.

Figure 14:
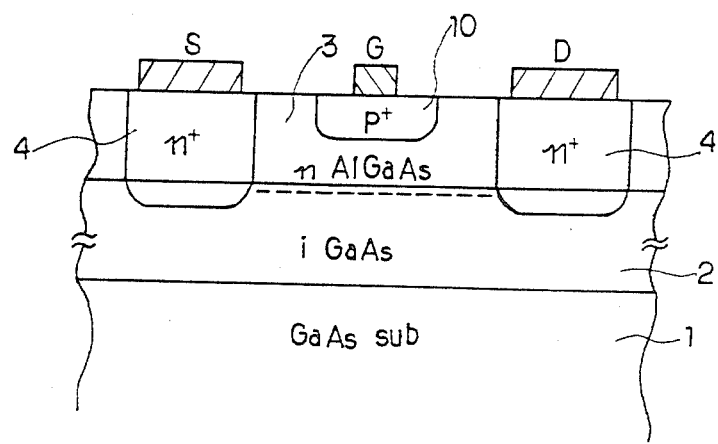
FIG. 14 is a schematic cross-sectional view of an element of an equipment for sensing an image in accordance with one embodiment of the present invention.
Figure 15:
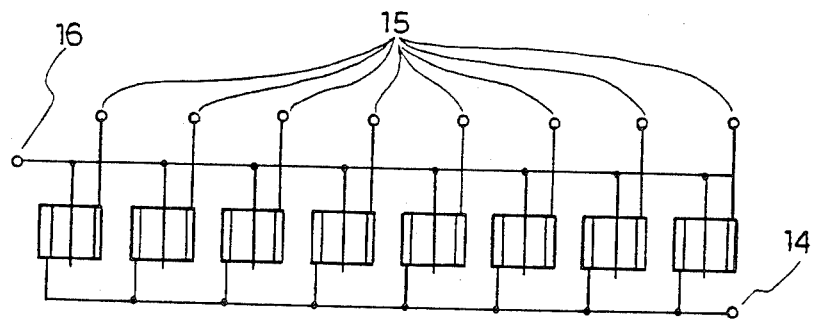
FIG. 15 is a connection diagram of an array type image sensor in accordance with one embodiment of the present invention.
Figure 16:
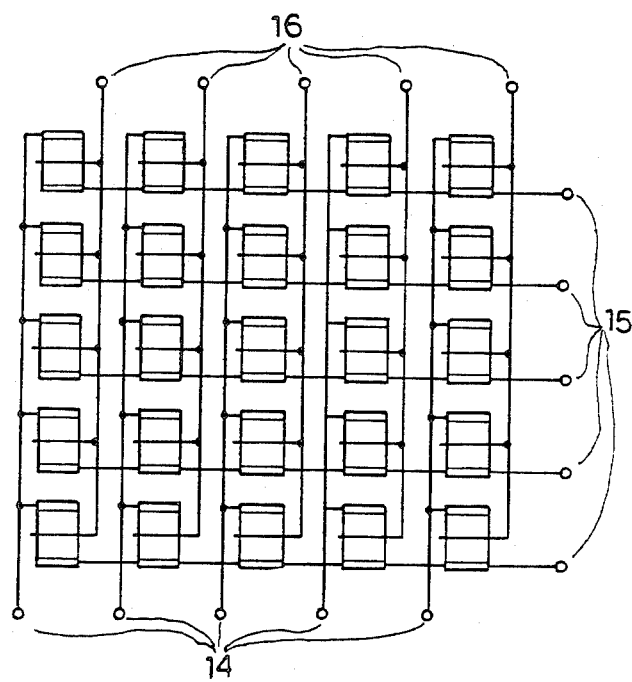
FIG. 16 is a connection diagram of a matrix type image sensor in accordance with one embodiment of the present invention.

Referring to FIG. 14, each element of the image sensing equipment in accordance with this embodiment is an active high electron mobility heterojunction semiconductor device or a HEMT provided with a layer configuration of an electron source layer 3 of an AlGaAs layer containing n-type impurities and a channel layer 2 of GaAs containing no impurities, a gate electrode G placed on a p-type region 10 produced in a limited upper portion of the electron source layer 3, and a pair of source and drain electrodes S and D ohmicly connected with the channel layer 2 through a pair of alloyed regions 4. As described earlier, once this element is exposed to an electromagnetic wave such as from a source of light, at a cryogenic temperature, the two-dimensional electron gas 9 accumulates along the heterojunction between the electron source layer 3 and the channel layer 2 and remains unvolatilized, unless the element is warmed far beyond 77° K. This means that this element can be utilized as an image sensor having a memory function. Therefore, an array or a matrix of a plurality of these elements, respectively illustrated in FIGS. 15 and 16, can act as an equipment for sensing an image. Referring to FIGS. 15 and 16, all the sources of the elements included in a row are connected with one another to be connected to a terminal 14 which is the output terminal of the row, and all the drains of the elements included in a column are connected with one another to be connected to a terminal 15 which is the output terminal of the column. Therefore, addressing each element through the terminals 14 and the terminals 16 enables reproduction of an image. The function of the terminals 16 which connect all the gates of elements in the image sensor is to disperse the two-dimensional electron gas caused by the exposure of the image sensor to the light without increasing the temperature of the image sensor.

Figure 17:
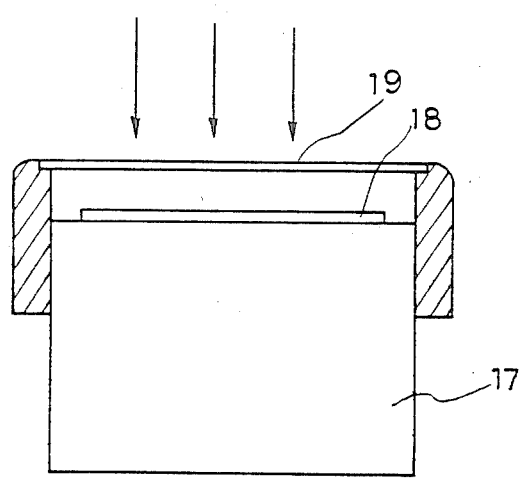
FIG. 17 is a schematic side view of an equipment for sensing an image in accordance with one embodiment of the present invention.

FIG. 17 illustrates an example of an image sensor in accordance with this embodiment. Referring to FIG. 17, the cryogenic container 17 contains the array or the matrix 18 of a plurality of the image sensing elements each of which receives and senses the light which has penetrated a window or an optional system 19.

It is needless to emphasize that HEMTs provided with an insulated gate for the purpose of dispersing the two-dimensional electron gas without increasing the temperature thereof can replace the foregoing HEMTs provided with a gate placed on a p-type region produced in a limited upper region of the electron source layer.

Further, if a warming process is allowed for dispersion of the two-dimensional electron gas, a high electron mobility heterojunction semiconductor device provided with a pair of output electrodes, but without a control electrode or a HEMT from which the control electrode is removed, can replace either of the foregoing image sensing elements.

The foregoing description clarifies that an equipment for sensing an image having the memory function is realized in accordance with any of these embodiments, satisfying the eighth object of the present invention.

Although the invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modification or embodiments as fall within the true scope of this invention.

What is claimed is:

1. A high electron mobility heterojunction semiconductor device comprising:

a pair of layers including an electron source layer and a channel layer for providing a heterojunction therebetween, said channel layer having an electron affinity larger than that of said electron source layer, said pair of layers being arranged for exposing at least one portion thereof to an electromagnetic wave; and a container for holding said pair of layers at a sufficiently low temperature for maintaining an electron gas which forms in said channel layer adjacent the heterojunction, said electron source layer containing substantially no impurities and said channel layer containing substantially no impurities, and the device characteristics can be changed as a result of the surface density of said electron gas being changed by exposure to said electromagnetic wave.

2. The device of claim 1, comprising a high electron mobility transistor including:

a semi-insulating semiconductor substrate upon which said pairs of layers is formed;

a control electrode formed on said pair of layers for allowing side electromagnetic wave to pass through said control electrode; and a pair of output electrodes placed at opposite sides of said contorl electrode on said pair of layers.

3. The transistor of claim 2 wherein said control electrode is a Schottky barrier gate type electrode.

4. The transistor of claim 2 wherein said control elctrode is an insulated gate type electrode.

5. The device of claim 1, comprising a passive high electron mobility heterojunction semiconductor component haing an opaque film covering a portion of said pair of layers to allow an uncovered portion of said pair of layers to be exposed to said electromagnetic wave.

6. The device of claim 5, wherein said passive component is a connection channel.

7. The device of claim 5, wherein said passive component is an electrode of a capacitor.

8. A high electron mobility heterojunction semiconductor device including a substrate comprising:

a high elctron mobility transistor including:

a pair of layers including a channel layer formed on the substrate and an electron source layer formed on said channel layer for providing a heterojunction therebetween, said channel layer having an electron affinity larger than that of said electron source layer, said electron source layer having a p-type well formed in an upper region thereof and a control electrode being formed on said p-type well so as to allow an electromagnetic wave to pass through said control electrode a semi-insulating semiconductor substrate upon which said pairs of layers is formed so as to allow an electromagnetic wave to pass through said control electrode; and a characteristic-modulation electrode formed on said p-type well; and a container for holding said pair of layers at a sufficiently low temperature for maintaining an electron gas which forms in said channel layer adjacent the heterojunction, the device characteristics can be changed as a result of the surface density of said electron gas being changed by exposure of said pair of layers to said electromagnetic wave.

* * * * *

UNITED STATES PATENT AND TRADEMARK OFFICE
CERTIFICATE OF CORRECTION

PATENT NO. : 4,734,750

DATED : MARCH 29, 1988

INVENTOR(S) : SHIGERU OKAMURA ET AL.

It is certified that error appears in the above-identified patent and that said Letters Patent is hereby corrected as shown below:

Col. 1, line 33, "device" should be --device,--;
      line 41, "then" should be --than--.

Col. 2, line 59, "semicoductor" should be --semiconductor--.

Col. 9, line 4, "wich" should be --which--.

Col. 13, line 35, "thlckness" should be -- thickness--.

Col. 19, line 17, "concentrationof" should be --concentration of--.

Col. 20, line 50, "ouput" should be --output--.

Col. 24, line 38, "2" should be --2,--;
      line 40, "2" should be --2,--;
      line 40, "elc-" should be --elec- --;
      line 44, "haing" should be --having--;
      line 53, "elctron" should be --electron--;

UNITED STATES PATENT AND TRADEMARK OFFICE
CERTIFICATE OF CORRECTION

PATENT NO. : 4,734,750

DATED : March 29, 1988

INVENTOR(S) : SHIGERU OKAMURA ET AL

It is certified that error appears in the above-identified patent and that said Letters Patent is hereby corrected as shown below:

Col. 24, line 64, "electrode" should be --electrode;--.

Signed and Sealed this

Twenty-third Day of August, 1988

Attest:

DONALD J. QUIGG

Attesting Officer

Commissioner of Patents and Trademarks